United States Patent
Huang et al.

(10) Patent No.: US 10,373,941 B2
(45) Date of Patent: *Aug. 6, 2019

(54) PACKAGE-ON-PACKAGE STRUCTURES AND METHODS FOR FORMING THE SAME

(71) Applicant: Taiwan Semiconductor Manufacturing Company, Ltd., Hsinchu (TW)

(72) Inventors: Kuei-Wei Huang, Hsinchu (TW); Chih-Wei Lin, Zhubei (TW); Hsiu-Jen Lin, Zhubei (TW); Wei-Hung Lin, Xinfeng Township (TW); Ming-Da Cheng, Jhubei (TW); Chung-Shi Liu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/912,807

(22) Filed: Mar. 6, 2018

(65) Prior Publication Data
US 2018/0197847 A1 Jul. 12, 2018

Related U.S. Application Data

(60) Continuation of application No. 15/231,884, filed on Aug. 9, 2016, now Pat. No. 9,935,091, which is a
(Continued)

(51) Int. Cl.
*H01L 23/02* (2006.01)
*H01L 25/00* (2006.01)
(Continued)

(52) U.S. Cl.
CPC .......... *H01L 25/50* (2013.01); *H01L 21/4853* (2013.01); *H01L 21/4867* (2013.01);
(Continued)

(58) Field of Classification Search
CPC . H01L 3334/48227; H01L 2224/73265; H01L 2924/181; H01L 2224/32145
(Continued)

(56) References Cited

U.S. PATENT DOCUMENTS 6,590,287 B2  7/2003  Ohuchi
7,262,080 B2 * 8/2007  Go .................... H01L 23/3128
                                                            257/686
(Continued)

FOREIGN PATENT DOCUMENTS

CN        101958261 A    1/2011
JP       2010109032 A    5/2010
(Continued)

*Primary Examiner* — S. V. Clark
(74) *Attorney, Agent, or Firm* — Slater Matsil, LLP

(57) ABSTRACT

A package includes a package component, which further includes a top surface and a metal pad at the top surface of the package component. The package further includes a non-reflowable electrical connector over and bonded to the metal pad, and a molding material over the package component. The non-reflowable electrical connector is molded in the molding material and in contact with the molding material. The non-reflowable electrical connector has a top surface lower than a top surface of the molding compound.

20 Claims, 7 Drawing Sheets

Related U.S. Application Data division of application No. 13/922,117, filed on Jun. 19, 2013, now Pat. No. 9,412,723.

(60) Provisional application No. 61/783,050, filed on Mar. 14, 2013.

(51) Int. Cl.

| | | |
|---|---|---|
| *H01L 25/07* | (2006.01) | |
| *H01L 25/10* | (2006.01) | |
| *H01L 23/498* | (2006.01) | |
| *H01L 21/48* | (2006.01) | |
| *H01L 21/56* | (2006.01) | |
| *H01L 23/14* | (2006.01) | |
| *H01L 23/00* | (2006.01) | |
| *H01L 21/60* | (2006.01) | |

(52) U.S. Cl.
CPC ...... *H01L 21/565* (2013.01); *H01L 23/49816* (2013.01); *H01L 23/49822* (2013.01); *H01L 23/49827* (2013.01); *H01L 23/49894* (2013.01); *H01L 25/074* (2013.01); *H01L 25/105* (2013.01); *H01L 23/147* (2013.01); *H01L 24/16* (2013.01); *H01L 24/32* (2013.01); *H01L 24/48* (2013.01); *H01L 2021/60045* (2013.01); *H01L 2021/60135* (2013.01); *H01L 2224/16225* (2013.01); *H01L 2224/32225* (2013.01); *H01L 2224/45099* (2013.01); *H01L 2224/48091* (2013.01); *H01L 2224/48227* (2013.01); *H01L 2224/73265* (2013.01); *H01L 2225/1023* (2013.01); *H01L 2225/1058* (2013.01); *H01L 2924/00014* (2013.01); *H01L 2924/01322* (2013.01); *H01L 2924/12042* (2013.01); *H01L 2924/1533* (2013.01); *H01L 2924/15311* (2013.01); *H01L 2924/181* (2013.01); *H01L 2924/18161* (2013.01)

(58) Field of Classification Search
USPC ........................................ 257/686, 777, 778
See application file for complete search history.

(56) References Cited

U.S. PATENT DOCUMENTS

| | | | | |
|---|---|---|---|---|
| 7,777,351 | B1* | 8/2010 | Berry | ............... H01L 23/3128 257/778 |
| 8,012,797 | B2* | 9/2011 | Shen | ............... H01L 21/4853 438/107 |
| 8,390,108 | B2 | 3/2013 | Cho et al. | |
| 8,421,203 | B2 | 4/2013 | Chi et al. | |
| 9,006,032 | B2 | 4/2015 | Cheng et al. | |
| 9,412,723 | B2* | 8/2016 | Huang | ............... H01L 25/074 |
| 2005/0121764 | A1* | 6/2005 | Mallik | ............. H01L 23/49816 257/686 |
| 2008/0017968 | A1* | 1/2008 | Choi | ............... H01L 21/565 257/686 |
| 2008/0073769 | A1 | 3/2008 | Wu | |
| 2009/0146301 | A1 | 6/2009 | Shimizu et al. | |
| 2010/0105173 | A1 | 4/2010 | Fujimori | |
| 2010/0117218 | A1 | 5/2010 | Park et al. | |

FOREIGN PATENT DOCUMENTS

| | | |
|---|---|---|
| KR | 20080007893 A | 1/2008 |
| KR | 1020100009941 A | 1/2010 |
| KR | 1020100053762 A | 5/2010 |

* cited by examiner

PACKAGE-ON-PACKAGE STRUCTURES AND METHODS FOR FORMING THE SAME

PRIORITY CLAIM AND CROSS-REFERENCE

This application is a continuation of U.S. patent application Ser. No. 15/231,884, entitled "Package-on-Package Structures and Methods for Forming the Same," filed on Aug. 9, 2016, which is a divisional of U.S. patent application Ser. No. 13/922,117, entitled "Package-on-Package Structures and Methods for Forming the Same," filed on Jun. 19, 2013, now U.S. Pat. No. 9,412,723 issued Aug. 9, 2016, which application claims the benefit of U.S. Provisional Application No. 61/783,050, filed on Mar. 14, 2013, and entitled "Package-on-Package Structures and Methods for Forming the Same," which applications are hereby incorporated herein by reference.

BACKGROUND

In a conventional Package-on-Package (PoP) process, a top package, in which a first device die is bonded, is further bonded to a bottom package through solder balls. The bottom package may also include a second device die bonded therein. The second device die may be on the same side of the bottom package as the solder balls.

Before the bonding of the top package to the bottom package, a molding compound is applied on the bottom package, with the molding compound covering the second device die and the solder balls. Since the solder balls are buried in the molding compound, a laser ablation or drilling is performed to form holes in the molding compound, so that the solder balls are exposed. The top package and the bottom package may then be bonded through the solder balls in the bottom package.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Package-on-Package (PoP) structure and the method of forming the same are provided in accordance with various embodiments. The intermediate stages of forming the PoP structure are illustrated in accordance with some embodiments. The variations of the embodiments are discussed. Throughout the various views and illustrative embodiments, like reference numbers are used to designate like elements.

Figure 1:
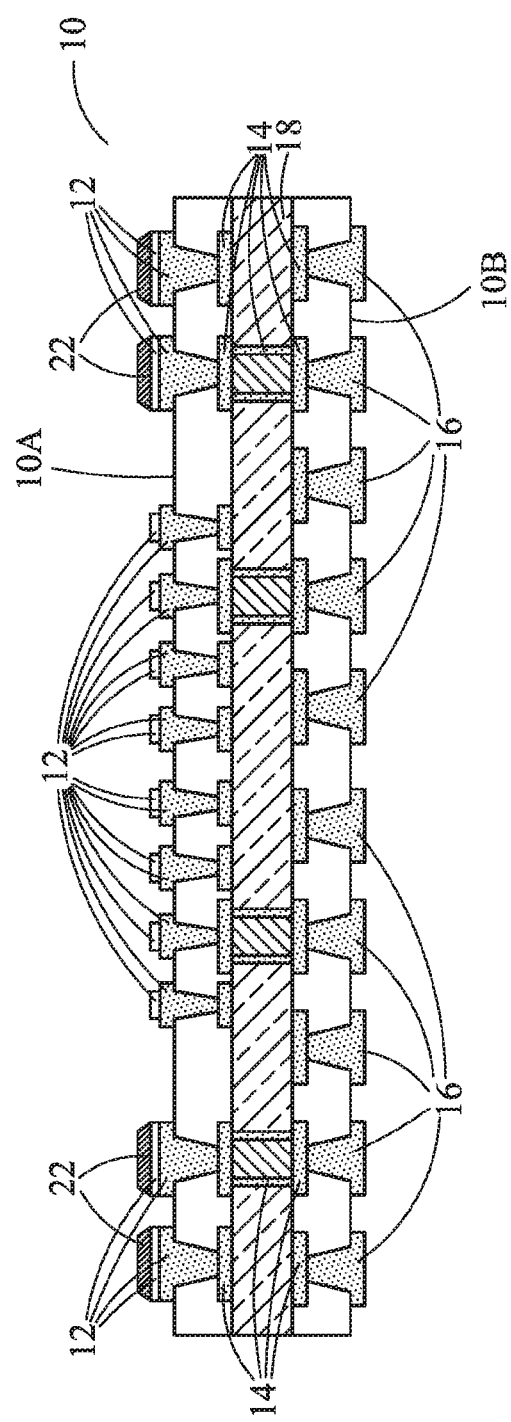
FIGS. 1 through 6B are cross-sectional views of intermediate stages in the manufacturing of a package-on-package structure in accordance with some exemplary embodiments.

Referring to FIG. 1, package component 10 is provided. In some embodiments, package component 10 is package substrate, and hence throughout the description, package component 10 is referred to as package substrate 10, although it can be of other types. In alternative embodiments, package component 10 comprises an interposer. Package component 10 may be a part of a package component that includes a plurality of identical package components 10. For example, package component 10 may be a package substrate, and is located in an un-sawed package substrate strip that comprises a plurality of package substrates formed as an array.

Package substrate 10 may comprise substrate 18 that is formed of a dielectric material. Alternatively, substrate 18 may be formed of other materials such as a semiconductor material, for example, silicon. In some exemplary embodiments, substrate 18 is a build-up substrate that is built on a core, as shown in FIG. 1. Alternatively, substrate 18 may be a laminate substrate which includes laminated dielectric films adhered together through lamination. When substrate 18 is formed of a dielectric material, the dielectric material may comprise composite materials that are mixed with glass fiber and/or resin.

Package substrate 10 is configured to electrically couple electrical connectors 12 on first surface 10A to conductive features 16 on second surface 10B, wherein surfaces 10A and 10B are opposite surfaces of package substrate 10. Electrical connectors 12 and conductive features 16 may be metal pads, for example, and hence are referred to as metal pads 12 and 16, respectively. Package substrate 10 may include conductive connections such as metal lines/vias 14, which may further comprise through-vias penetrating through substrate 18.

Figure 2:
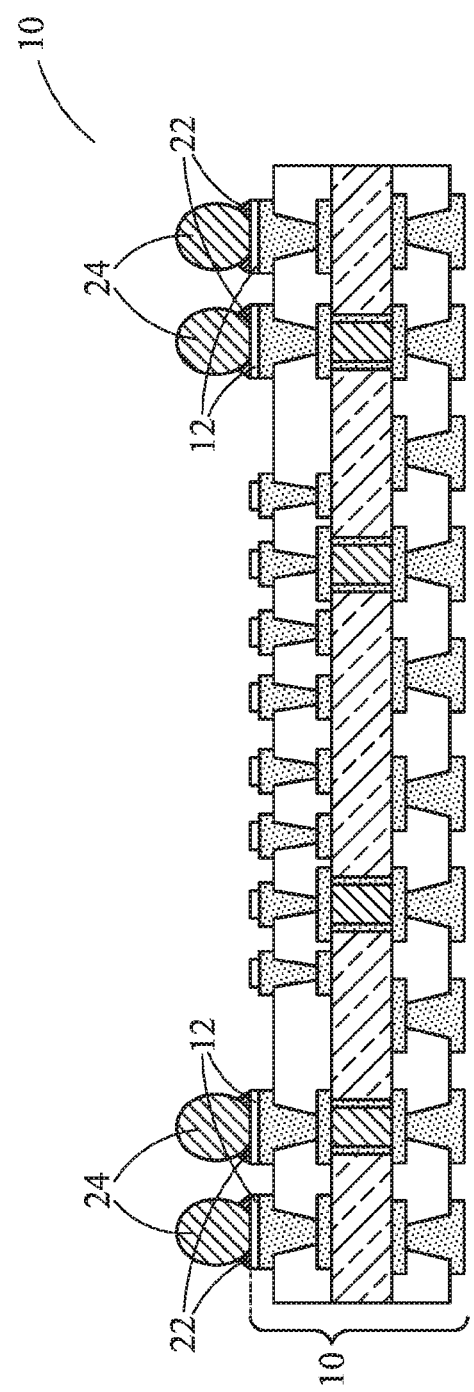

In some embodiments, solder paste 22 is coated on some or all metal pads 12. Next, as shown in FIG. 2, electrical connectors 24 are bonded on metal pads 12. The bonding may include placing electrical connectors 24 on solder paste 22, and heating package substrate 10, so that electrical connectors 24 are secured on metal pads 12. Electrical connectors 24 are electrically connected to metal pads 12, wherein solder paste 22 provides the securing force to fix electrical connectors 24. In addition, solder paste 22 helps in providing an electrical connection between electrical connectors 24 to the underlying metal pads 12.

In some embodiments, electrical connectors 24 are non-reflowable metal balls. Electrical connectors 24 do not melt under the temperatures that are typically used for melting solders, which temperatures may be in the range of about 200° C. to about 280° C., for example. In accordance with some embodiments, electrical connectors 24 are copper balls, aluminum balls, or the like. Electrical connectors 24 may also include metals selected from the group consisting essentially of copper, aluminum, nickel, platinum, tin, tungsten, and alloys thereof. The shapes of electrical connectors 24 may be near-perfect ball shapes in some embodiments, except that the formation of balls may have process variations. After the bonding of electrical connectors 24, electrical connectors 24 may remain to have a ball shape, with the bottom end of each of the balls 24 contacting the respective underlying metal pad 12 through a point, although the balls may also be spaced apart from the underlying metal pads 12 by a thin layer of solder paste 22. The bottom surface (which is a part of a near-perfect surface of a ball) of each of electrical connectors 24 is also electrically coupled to the respective underlying metal pad 12 through solder paste 22, and also possibly through the contacting point.

In alternative embodiments, electrical connectors 24 are solder balls, which may comprise either eutectic solder or non-eutectic solder. When formed of solder, the bonding of electrical connectors 24 includes a reflow process, wherein the solder-containing electrical connectors 24 are reflowed.

In these embodiments, solder paste 22 may not be used. Instead, a flux (not shown) may be applied to improve the reflow.

Figure 3:
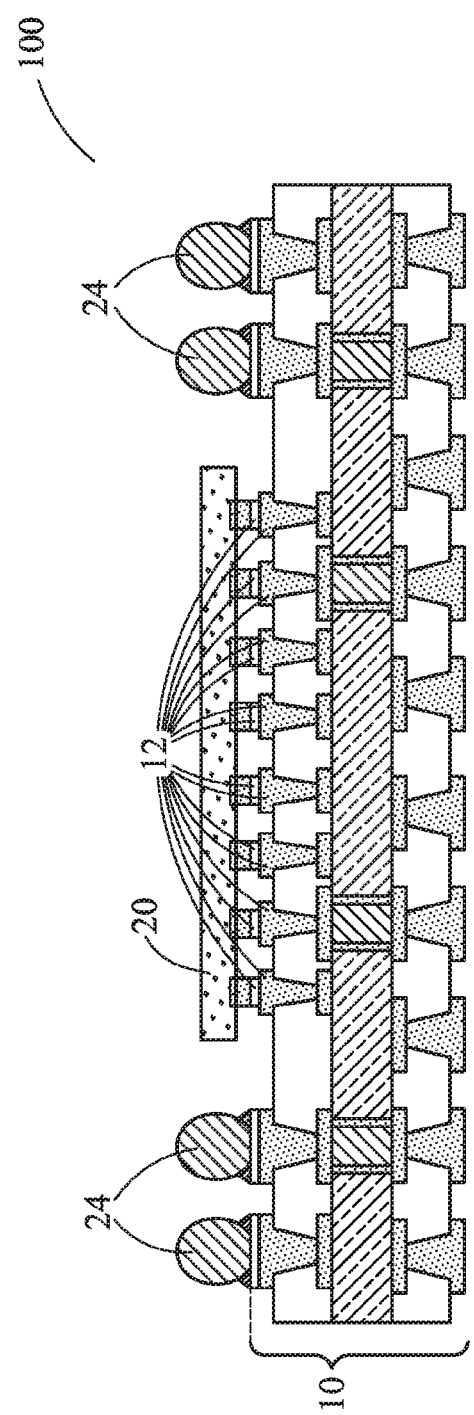

Referring to FIG. 3, package component 20 is bonded to package substrate 10 through metal pads 12. Hence, bottom package 100, which includes package substrate 10 and die 20, is formed. Package component 20 may be a device die, and hence is alternatively referred to as die 20 hereinafter, although it may also be another type of package component such as a package. Dies 20 may be a circuit die comprising integrated circuit device (not shown) such as transistors, capacitors, inductors, resistors, and/or the like. Furthermore, die 20 may be a logic circuit die such as a Central Computing Unit (CPU) die. The bonding of die 20 to metal pads 12 may be achieved through solder bonding or direct metal-to-metal bonding (such as copper-to-copper bonding).

Figure 4:
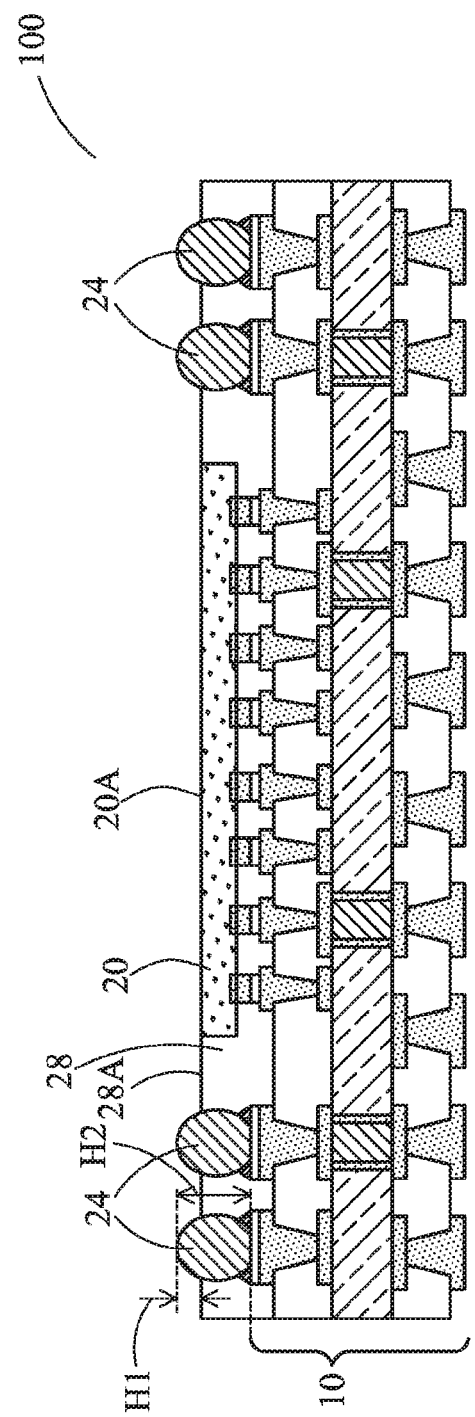

Referring to FIG. 4, molding material 28 is molded on die 20 and package substrate 10. A curing process is performed after molding material 28 is applied. Molding material 28 may include a filler, a polymer, and a hardener in accordance with some embodiments. In an exemplary embodiment, the polymer may be a molding compound, an underfill, a Molding Underfill (MUF), an epoxy, or the like. In some embodiments, molding material 28 has its top surface 28A level with the top surface 20A of die 20, and hence die 20 is exposed through molding material 28. In alternative embodiments, molding material 28 may fully encapsulate die 20 therein, with a portion of molding material 28 being overlapping die 20. In yet alternative embodiments, molding material 28 may encircle and be in contact with the lower part of die 20, while the upper part of die 20 is over top surface 28A of molding material 28.

The top portions of electrical connectors 24 are over top surface 28A of molding material 28. In some exemplary embodiments, height H1 of the upper portions of electrical connectors 24 that are over top surface 28A is greater than about ¼, or greater than about ⅓, of height H2 of electrical connectors 24. Ratio H1/H2 may also be close to 0.5 in some embodiments.

Figure 5:
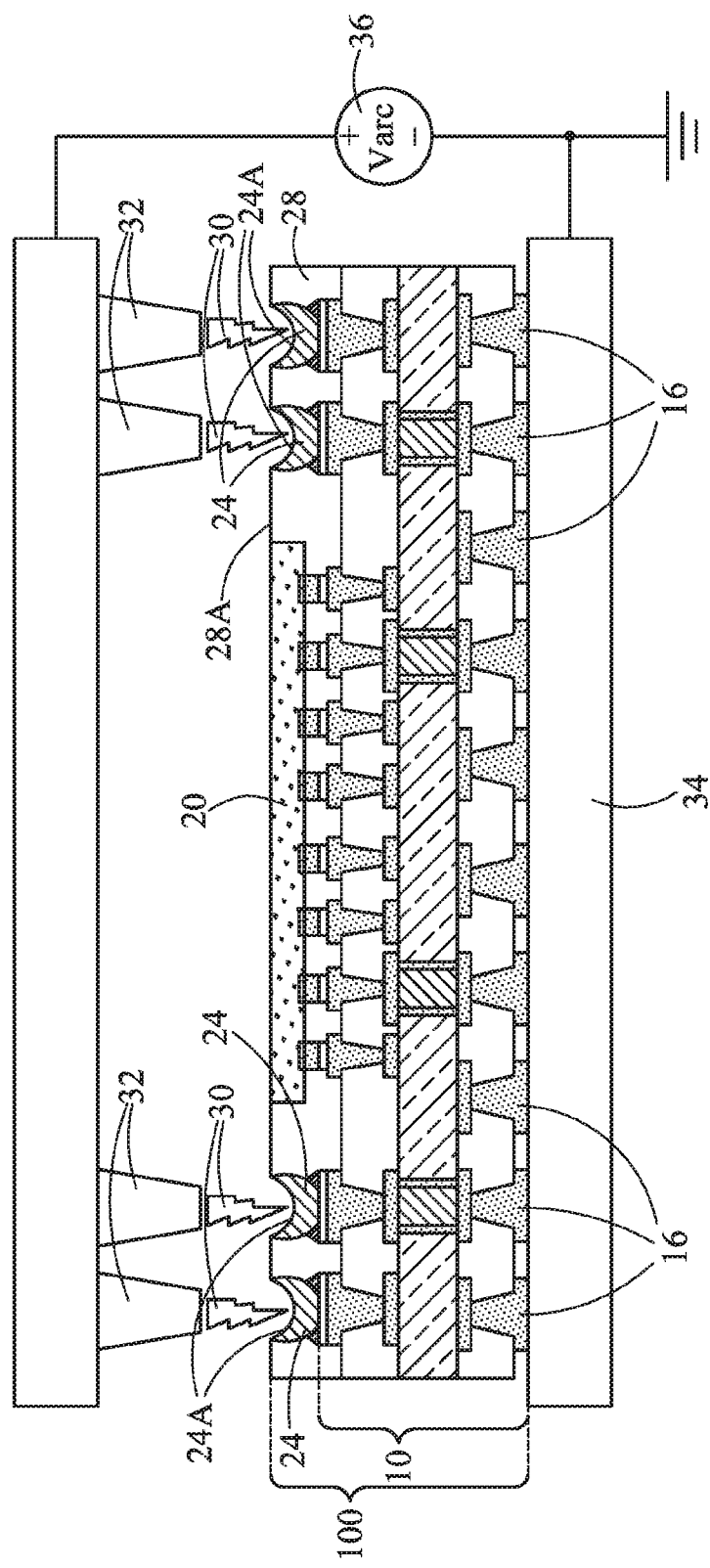

Referring to FIG. 5, the top portions of electrical connectors 24 are removed. The bottom portions of electrical connectors 24 remain un-removed, and hence electrical connectors 24 become partial balls. In some embodiments, the removal of electrical connectors 24 is performed by generating electrical arc 30 between electrical connectors 24 and electrodes 32. The temperature of electrical arc 30 may cause the exposed surface portions of electrical connectors 24 to rise to a very high temperature, for example, between about 8,000° C. and about 12,000° C., and hence the surface portions of electrical connectors 24 are evaporated. In accordance with some embodiments, to generate electrical arc 30, a plurality of electrodes 32, which are formed of metal, are placed over, and are aligned to electrical connectors 24. Each of the electrical connectors 24 that is intended to have it top portion removed is aligned to one of the electrodes 32. Voltage Varc is applied between electrodes 32 and electrical connectors 24 in order to generate electrical arc 30, wherein voltage source 36 is electrically coupled to electrodes 32 and electrical connectors 24 to provide voltage Varc therebetween. Voltage Varc may range from, for example, about 50 V to about 500 V, although different voltages may be used.

In some embodiments, electrical connectors 24 are electrically grounded, for example, through bottom metal pads 16 and bottom electrode 34, which electrically connect metal pads 16 to voltage source 36. Since metal pads 16 are electrically connected to electrical connectors 24, connectors 24 are electrically coupled to voltage source 36. During the generation of electric arc 30, electrodes 32 may be controlled to approach electrical connectors 24. The electrical fields between electrodes 32 and electrical connectors 24 accordingly rise, and eventually electrical arc 30 occurs when the distances between electrodes 32 and electrical connectors 24 are short enough. After the top portions of electrical connectors 24 are removed, electrodes 32, 34, and voltage source 36 are taken away.

In some embodiments, after the top portions of electrical connectors 24 are removed, the resulting top surfaces 24A of electrical connectors 24 are non-planar. For example, top surfaces 24A may be rounded, with the lowest points close to the centers of the respective top surfaces 24A. Furthermore, at least parts of top surfaces 24A may be lower than top surface 28A of molding material 28. In some embodiments, the entireties of electrical connectors 24 are level with or lower than top surface 28A of molding material 28, which means that the entities of top surfaces 24A are level with or lower than top surface 28A of molding material 28.

Figure 6A:
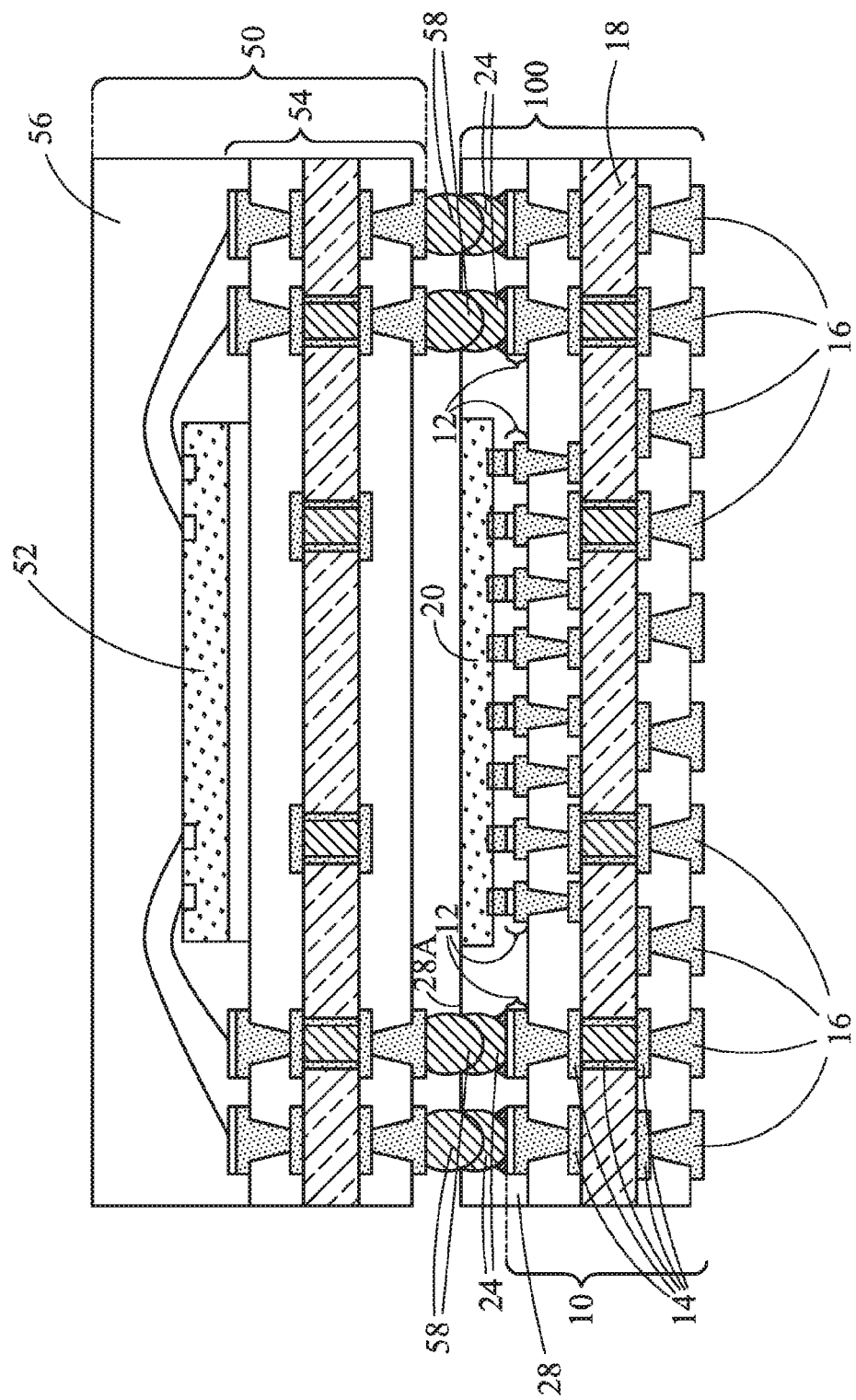
Figure 6B:
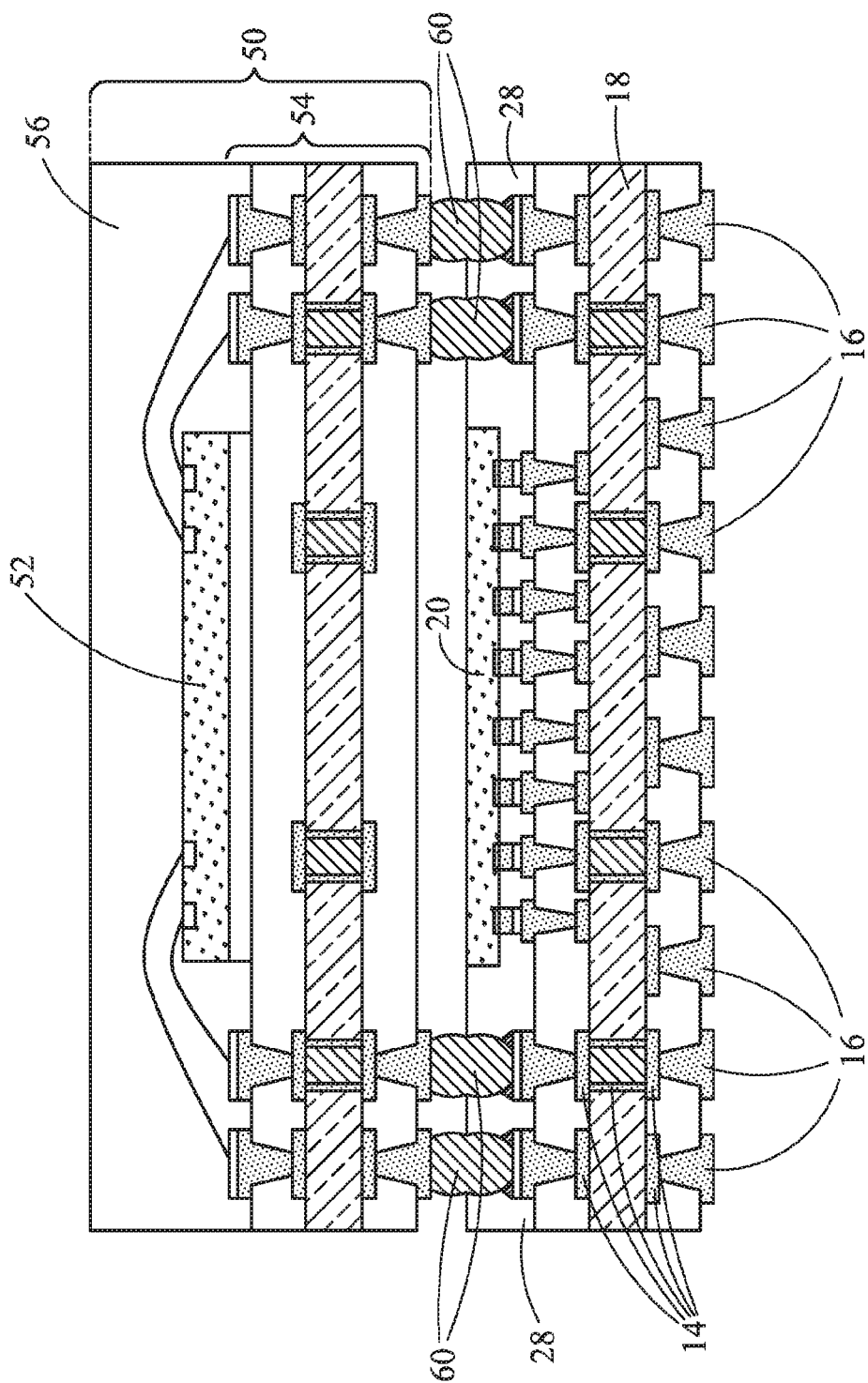

FIGS. 6A and 6B illustrate the bonding of top package 50 to bottom package 100. The resulting structure is hence a PoP structure. For example, referring to FIG. 6A, top package 50 is first placed over package substrate 10. Top package 50 may be a package that includes device die 52 and package substrate 54, wherein device die 52 is bonded to package substrate 54. In some exemplary embodiments, device die 52 is a memory die such as a Static Random Access Memory (SRAM) die, a Dynamic Random Access Memory (DRAM) die, or the like. Furthermore, molding material 56 may be pre-molded on device dies 52 and package substrate 54 before the bonding of top package 50 to package substrate 10.

In some embodiments, top package 50 includes electrical connectors 58 at the bottom surface of top package 50. The positions of electrical connectors 58 are aligned to the positions of electrical connectors 24. Since electrical connectors 24 are recessed below the top surface 28A of molding material 28, electrical connectors 58 may be settled in the recesses easily, and hence top package 50 does not slide with relative to bottom package 100. Furthermore, since electrical connectors 24 are recessed, the total thickness of the resulting PoP structure is reduced. In some embodiments, electrical connectors 58 comprise solder, and may be solder balls. In alternative embodiments, electrical connectors 58 may comprise non-reflowable portions such as metal pillar or a metal pad. The non-reflowable portions of electrical connectors 58 may be formed of a material selected from the same candidate materials of non-reflowable electrical connectors 24. Furthermore, electrical connectors 58 may comprises solder caps on the surface of the non-reflowable portion.

Referring to FIG. 6A, in the embodiments in which electrical connectors 24 are non-reflowable, the solder in electrical connectors 58 are reflowed, during which time electrical connectors 24 are not reflowed. The resulting electrical connectors 58 bond electrical connectors 24 to top package 50. After the reflow, electrical connectors 58 have the bottom surfaces fitting the shapes and the profiles of the top surfaces of electrical connectors 24.

Referring to FIG. 6B, in the embodiments in which electrical connectors 24 comprise solder, after a reflow process, the solder in solder balls 58 is merged with the solder in electrical connectors 24 to form solder regions 60, which join top package 50 to package substrate 10.

In the embodiments of the present disclosure, by removing the top portions of the electrical connectors in the bottom package, the overall height of the PoP structure is reduced.

Furthermore, non-reflowable metal balls are used in the bottom package. As a result, the pitch of the electrical connectors bonding the top package to the bottom package may be reduced since the sizes and the shapes of the non-reflowable metal balls are easy to control.

In accordance with some embodiments, a package includes a package component, which further includes a top surface and a metal pad at the top surface of the package component. The package further includes a non-reflowable electrical connector over and bonded to the metal pad, and a molding material over the package component. The non-reflowable electrical connector is molded in the molding material and in contact with the molding material. The non-reflowable electrical connector has a top surface lower than a top surface of the molding compound.

In accordance with other embodiments, a package includes a package substrate comprising a top surface, and a metal pad at the top surface of the package substrate. A partial metal ball is disposed over and bonded to the metal pad, wherein the partial metal ball is formed of a non-reflowable material. A die is over and bonded to the package substrate. A molding material is disposed over the package substrate, wherein the partial metal ball and a lower portion of the die are molded in the molding material.

In accordance with yet other embodiments, a method includes molding a molding material over a package substrate to form a bottom package, wherein an electrical connector of the bottom package is exposed through a top surface of the molding material. A top portion of the electrical connector is then removed using an electrical arc, wherein a bottom portion of the electrical connector remains after the step of removing.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
  a bottom package comprising:
    a first package component comprising:
      a top surface; and
      a conductive pad at the top surface;
    an electrical connector over and contacting the conductive pad, wherein a top surface of the electrical connector comprises a rounded portion, with a center portion of the rounded portion being lower than surrounding portions of the rounded portion; and
    an encapsulating material over the first package component.

2. The package of claim 1, wherein the electrical connector has a rounded bottom surface, with the rounded bottom surface having a shape of a part of a ball.

3. The package of claim 2 further comprising a solder paste contacting both the rounded bottom surface of the electrical connector and a top surface of the conductive pad.

4. The package of claim 1 further comprising:
  a top package over the bottom package; and
  a solder region bonding the electrical connector to the top package, wherein the solder region contacts the rounded portion of the top surface of the electrical connector.

5. The package of claim 4, wherein the electrical connector is formed of a non-solder conductive material.

6. The package of claim 4, wherein the encapsulating material comprises a top surface, and the solder region extends to a level lower than the top surface of the encapsulating material.

7. The package of claim 1 further comprising a device die bonded to the top surface of the first package component, wherein the device die is in the encapsulating material.

8. The package of claim 1, wherein the center portion of the rounded portion is a lowest portion of the top surface of the electrical connector.

9. A package comprising:
  a bottom package comprising:
    a package component comprising:
      a first conductive feature at a top surface of the package component; and
      a second conductive feature at a bottom surface of the package component, wherein the first conductive feature is electrically coupled to the second conductive feature;
    a partial metal ball having a rounded bottom surface in contact with a top surface of the first conductive feature, and the partial metal ball has a top surface recessing toward a center of the partial metal ball;
    a die over and bonded to the package component;
  a top package over the bottom package; and
  a solder region bonding the partial metal ball to the top package.

10. The package of claim 9, wherein the partial metal ball has a non-planar top surface.

11. The package of claim 10, wherein the top surface of the partial metal ball comprises a rounded portion, with a lowest point of the rounded portion being close to a center of the top surface of the partial metal ball.

12. The package of claim 9, wherein the rounded bottom surface of the partial metal ball has a spherical shape.

13. The package of claim 9 further comprising an encapsulating material over the package component, with the die encapsulated by the encapsulating material, wherein at least a part of the partial metal ball is lower than a top surface of the encapsulating material.

14. The package of claim 9 further comprising a solder paste in physical contact with both the rounded bottom surface of the partial metal ball and the top surface of the first conductive feature.

15. The package of claim 9, wherein the partial metal ball comprises copper.

16. A package comprising:
  a bottom package comprising:
    a package component comprising:
      a top surface; and
      a metal pad at the top surface of the package component;

a partial metal ball over and electrically coupling to the metal pad; and a die over and bonded to the package component; and a solder region over and joined to the partial metal ball.

17. The package of claim 16 further comprising an encapsulating material encapsulating the partial metal ball therein, wherein a center portion of a top surface of the partial metal ball is lower than a top surface of the encapsulating material.

18. The package of claim 17, wherein an entirety of the top surface of the partial metal ball is lower than the top surface of the encapsulating material.

19. The package of claim 16 further comprising a solder paste in contact with a rounded bottom surface of the partial metal ball and a top surface of the metal pad.

20. The package of claim 16, wherein the partial metal ball has a rounded bottom surface, with a bottom tip of the rounded bottom surface contacting a top surface of the metal pad.

* * * * *